United States Patent [19]

Irikawa et al.

[11] Patent Number: 5,319,661
[45] Date of Patent: Jun. 7, 1994

[54] SEMICONDUCTOR DOUBLE HETEROSTRUCTURE LASER DEVICE WITH INP CURRENT BLOCKING LAYER

[75] Inventors: Michinori Irikawa, Yokohama; Masayuki Iwase, Tokyo, both of Japan

[73] Assignee: The Furukawa Electric Co., Ltd., Tokyo, Japan

[21] Appl. No.: 77,191

[22] Filed: Jun. 16, 1993

Related U.S. Application Data

[63] Continuation-in-part of Ser. No. 814,271, Dec. 27, 1991, abandoned.

[30] Foreign Application Priority Data

Dec. 27, 1990 [JP] Japan .................. 2-417845

[51] Int. Cl.$^5$ .................................................. H01S 3/19
[52] U.S. Cl. ........................................... 372/46; 372/43; 372/44; 372/45; 372/50; 372/96; 257/12; 257/14; 257/183
[58] Field of Search .................. 372/7, 43, 44, 45, 46, 372/47, 48, 49, 50, 96, 99, 109; 257/183, 184, 196, 200, 12, 14, 23

[56] References Cited

U.S. PATENT DOCUMENTS

| | | | |
|---|---|---|---|
| 4,416,011 | 11/1983 | Olsen | 372/46 X |
| 4,426,700 | 1/1984 | Hirao et al. | 372/45 |
| 4,480,331 | 10/1984 | Thompson | 372/46 X |
| 4,484,332 | 11/1984 | Hawrylo | 372/50 |
| 4,496,403 | 1/1985 | Turley | 372/46 X |
| 4,660,208 | 4/1987 | Johnston, Jr. et al. | 372/46 |
| 4,870,468 | 9/1989 | Kinoshita et al. | 372/46 X |
| 4,888,624 | 12/1989 | Johnston, Jr. et al. | 372/46 X |
| 5,111,471 | 5/1992 | Hattori | 372/46 |
| 5,138,625 | 8/1992 | Paoli et al. | 372/46 |
| 5,214,662 | 5/1993 | Irikawa et al. | 372/46 |

Primary Examiner—Brian Healy
Attorney, Agent, or Firm—Jacobson, Price, Holman & Stern

[57] ABSTRACT

A semiconductor laser device comprising a semiconductor substrate, a multi-layered double heterostructure having active layers, a pair of cladding layers, a ridged waveguide structure and a current confining structure formed between the semiconductor substrate and the active layer. With such an arrangement, injected current is narrowed not only on the side above the ridge of the active layer but also on the substrate side of the active layer to improve the threshold current and its current confinement performance. When the two lateral trenches of the ridge are embedded with resin layers, the ridge stripe width can be made narrow to improve the threshold current of the device. When the active layer is realized in a DCC structure having two active layers and having an intermediary clad layer sandwiched therebetween, the device will show a low threshold current circular beam divergence and stabilized thermal characteristics.

15 Claims, 2 Drawing Sheets

SEMICONDUCTOR DOUBLE HETEROSTRUCTURE LASER DEVICE WITH INP CURRENT BLOCKING LAYER

This application is a continuation-in-part of U.S. patent application Ser. No. 07/814,271, filed Dec. 27, 1991, now abandoned.

BACKGROUND OF THE INVENTION

This invention relates to a ridged waveguide-type semiconductor laser device having a reduced threshold current as well as other improved and useful properties.

A conventional ridged waveguide-type semiconductor laser devices typically has a structure as illustrated in FIG. 4 and is produced through a manufacturing process as described below.

First, an n-InP clad layer 2, an active layer 3, an antimeltback layer 4, a p-InP clad layer 5, a p-GaInAsP cap layer 6 are sequentially grown in the described order on an n-InP substrate 1 to form a multilayered structure and then an $SiO_2$ insulation layer is deposited on the top.

Then, an etching mask is prepared by a photolithography technique to cover specific areas of the multilayered structure and the covered multilayered structure is etched as deep as the antimeltback layer 4 to produce a pair of grooves cut into said multilayered structure.

After removing the etching mask, an insulation layer 7 is formed thereon and again a photolithography technique is used to cut a window for ohmic contact of a p-side electrode.

Finally, a p-side electrode 8 and an n-side electrode 9 are formed respectively on the upper surface of the multilayered structure and the lower surface of the substrate 1.

A semiconductor laser device as described above shows different refractive indexes relative to the active layer at the ridge portion located at the center of the upper surface and at the lateral grooves on the sides of the ridge portion. Consequently, it is normally provided with a waveguide designed on the basis of the difference of refractive index. Therefore, such a semiconductor laser device is normally called a "ridged" waveguide-type semiconductor laser device.

Since a ridged waveguide-type semiconductor laser device can be manufactured by way of a single epitaxial growth process, it is superior to semiconductor laser devices having a different structure in terms of yield, cost and mass production.

A ridged waveguide-type semiconductor laser device having the following characteristics is described by A. M. Rashid, IEEE J. Lightwave Tech. Vol. 6, 1988, pp. 25-29: threshold current level Ith=25~30 mA, optical output Pmax=30 mW, quantum efficiency $\eta_0$ =20~25% (oscillation wavelength $\lambda$=1.3 μm), angle of horizontal beams relative to the substrate $\Theta_{81}$ =16° and angle of vertical beams relative to the substrate $\Theta_\perp$=30°.

A known ridged waveguide-type semiconductor laser device is, however, accompanied by technological problems such as:

(1) Low current confinement effect and a high threshold current level.
(2) Large $\Theta_\perp/\Theta_{81}$ ratio due to the beam angles of $\Theta_\perp$=30° and $\Theta_\parallel$ 16°.
(3) The ridge stripe width cannot be made narrow since a window should be formed for ohmic contact within the ridged portion.
(4) Poor thermal characteristics because of poor heat conduction capability.

SUMMARY OF THE INVENTION

In view of these technological problems, it is therefore an object of the present invention to provide a semiconductor laser device having a low threshold current level, a small $\Theta_\perp/\Theta_\parallel$ ratio, a narrow ridge stripe width and improved thermal characteristics According to the present invention, the above object of the invention is achieved by providing a semiconductor laser device comprising a semiconductor substrate, a multilayered double heterostructure having an active layer and formed on said substrate and a ridged waveguide, and featuring a current confinement structure formed between the semiconductor substrate and the active layer.

A semiconductor laser device according to the present invention preferably meets one of the following technical requirements.

The current confinement structure formed between the semiconductor substrate of the first conductivity type and the active layer consists of an InP convex mesa stripe and a pair of InP current blocking layers, where said InP convex mesa stripe is formed by etching off part of said substrate or epitaxial layer on said substrate, and where said InP current blocking layers are of the second conductivity type and are embedded at both sides of said mesa stripe.

When the substrate is an n-type InP, the current confinement structure formed between the substrate and the active layer consists of a n-type InP convex mesa stripe and a pair of semi-insulating InP current blocking layers, where said InP mesa stripe is formed by etching off part of said substrate or epitaxial layer on said substrate, and where said semi-insulating InP current blocking layers are Fe-doped and are embedded at both sides of said mesa stripe.

When the substrate is a p-type InP, the current confinement structure formed between the substrate and the active layer consists of a p-type InP convex mesa stripe and pairs of current blocking layers, where said InP mesa stripe is formed by etching off part of said substrate or epitaxial layer on said substrate, and where said pairs of current blocking layers include a pair of Fe-doped semi-insulating InP layers embedded at both sides of said mesa stripe.

When the substrate is (100) oriented and of the first conductivity type, the current confinement structure consists of an InP convex mesa stripe and a pair of InP current blocking layers, where said InP convex mesa stripe is the first conductivity type and has an isosceles triangle cross section in (011 or 01$\bar{1}$) cleavage surface and has a pair of symmetrical (11$\bar{1}$)B surfaces, and where said pair of InP current blocking layers are of the second conductivity type covering partly said triangle shaped mesa stripe and are embedded at both sides of said mesa stripe, so that the top part of said mesa stripe is projecting into the cladding layer of the first conductivity type to form a current injection channel.

When the substrate is (100) oriented and of the first conductivity type, the current confinement structure consists of an InP convex mesa stripe and InP current blocking layers, where said InP convex mesa stripe is the first conductivity type and has an isosceles triangle cross section in (011 or 01$\bar{1}$) cleavage surface and has a pair of symmetrical (111)B surfaces, and where said InP current blocking layers include a pair of Fe-doped semi-insulating InP layers and cover said triangle shaped mesa stripe partly and are embedded at both sides of said mesa stripe, so that the top part of said mesa stripe is projecting into the cladding layer of the first conductivity type to form a current injection channel.

The two trenches at both sides of the ridged portion are embedded in resin layers.

The active layer is made of two separate layers with a DCC (double carrier confinement) structure having an intermediary clad layer interposed therebetween and/or it has either a single quantum well structure or a multiple quantum well structure and comprises an optical confinement layer having either an SCH structure or a GRIN-SCH structure.

It is manufactured by means of a liquid-phase epitaxial growth method and/or a vapor-phase epitaxial growth method.

Since a semiconductor laser device according to the invention features a current confinement structure formed between the semiconductor substrate and the active layer, injected current is confined not only at the ridge side but also at the substrate side of the active layer to improve the current confinement performance of the device.

When the semiconductor substrate of a semiconductor laser device according to the embodiments is made of either p-InP or n-InP, the current blocking structure consists of a pn junction.

The substrate according to the second embodiment is an n-InP, and the current blocking layer consists of an Fe-doped semi-insulating InP-layer.

The semiconductor substrate of a semiconductor laser device according to a third embodiment is made of p-InP, and the current blocking structure has a structure in which an Fe doped InP semi-insulating layer is sandwiched by the upper and the lower n-InP layers. Therefore, the p-InP layer and the Fe doped InP layer are not in direct contact with each other so that the semi-insulating property of the Fe doped InP layer is not deteriorated.

The current confinement structure may comprise a mesa stripe of the first conductivity type having a pair of symmetrical surfaces (111) B isosceles triangular cross section if cut through a cleavage surface (011) or (01$\bar{1}$) and formed to partly contact the upper surface of the semiconductor substrate and the lower surface of a cladding layer of the first conductivity type and the top of the stripe partially projects into the cladding layer of the first conductivity type disposed thereon to form a narrow channel. Therefore, a double heterostructure can be grown continuously after simultaneously forming a mesa stripe having an isosceles triangular cross section and the narrow channel for confining an electric current.

When the two lateral trenches of the ridge stripe of a semiconductor laser device according to the invention are embedded in resin layers, ohmic contact need not be limited within a ridge area.

With such an arrangement, therefore, a patterning operation can be easily conducted by photolithography and the ridge stripe width can be reduced to an optimum value from the view point of ohmic resistance and lasing threshold current.

The heat conductance capability of the device will be remarkably improved when the resin layers are made of polyimide resin.

Crystal of a semi-insulating n-type semiconductive material having a refractive index smaller than that of InP may be embedded and grown in place of the resin layers.

When the semiconductor substrate (e.g.: InP) of a semiconductor laser device according to the invention is of p-type, the ridge and the cap layer (e.g.: GaInAsP) are of n-type.

It is well known that an InP substrate of p-type has a specific resistance greater than that of an InP substrate of n-type and that a GaInAsP cap layer of n-type has a resistivity lower than that of a GaInAsP cap layer of p-type when they are in an equal doping concentration.

Therefore, when the semiconductor substrate is made of p-InP and the ridge and the cap layer are made of GaInAsP, the ridge stripe width and the threshold current may be further reduced because of a very low ohmic resistance.

When the active layer of a semiconductor laser device according to the invention is made of two separate layers with a DCC (double carrier confinement) structure having an intermediary clad layer interposed therebetween, $\Theta_\perp$ can be made as small as 20°.

Consequently, the $\Theta_\perp/\Theta_\parallel$ ratio can be remarkably improved to as small as 1.3 from the current level 1.9 so that the coupling efficiency of the laser beam from the semiconductor laser device to an optical fiber is improved. The DCC structure also shows excellent temperature stability.

Improvements on temperature characteristics of semiconductor laser devices with DCC structure are reported by M. Yano, et al., Journal Quantum.Electron 19, pp. 1319–1327, 1983.

So long as a semiconductor laser device according to the invention meets any of the above described technical requirements and it has either a single quantum well structure or a multiple quantum well structure and comprises an optical confinement layer having either an SCH structure or a GRIN-SCH structure, it maintains the above advantages.

A semiconductor laser device according to the invention can be manufactured by means of a known appropriate method such as a liquid-phase epitaxial method (LPE method) or a vapor phase epitaxial method (e.g.: MOCVD method).

Now, the present invention will be described in greater detail by referring to the accompanying drawings that illustrate preferred embodiments of the invention.

DETAILED DESCRIPTION OF THE INVENTION

Figure 1:
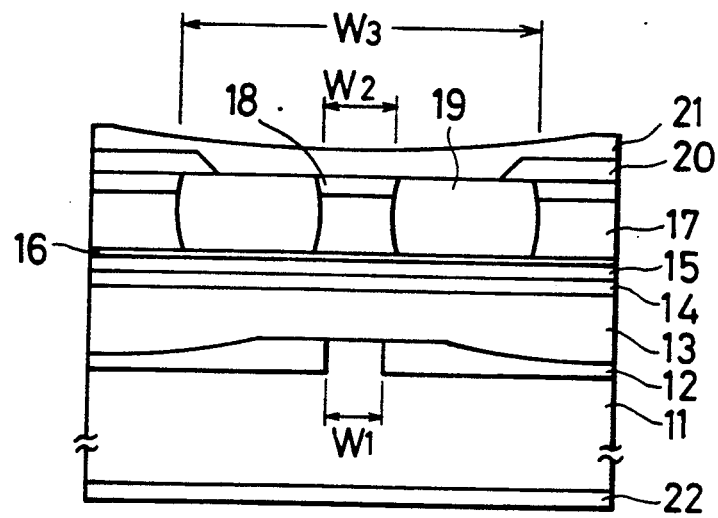
FIG. 1 is a sectional view of a first embodiment of the semiconductor laser device according to the invention.

The present invention will be described by first referring to FIG. 1 illustrating a first preferred embodiment of the invention.

In FIG. 1, an p-InP current blocking layer 12, an n-InP clad layer 13, a GaInAsP active layer 14, a p-InP clad layer 15, a p-GaInAsP etching stop layer 16, a p-InP clad layer 17, a p-GaInAsP cap layer 18, resin layers 19 made of polyimide resin and an insulation film layer 20 made of a dielectric material are sequentially formed in the described order on an n-InP substrate 11 to form a multilayered structure. In addition, a p-side electrode 21 is disposed on the upper surface of the multilayered structure, while an n-side electrode 22 is arranged on the lower surface of the n-InP substrate 11.

A semiconductor laser device as illustrated in FIG. 1 may be prepared through a manufacturing process as described below.

First, a piece of insulation film (not shown) made of $SiO_2$ or $Si_3N_4$ is deposited on an n-InP substrate 11 and then a stripe-shaped etching mask is formed by a photolithography technique. Then, unnecessary areas of the substrate are etched off by dry or wet etching so that a convex mesa stripe is formed under the etching mask. The convex mesa stripe has a width $W_1$ of 0.5 to 1 $\mu$m and a height of 0.5 to 2 $\mu$m.

The convex mesa stripe can also be formed by etching off part of n-type epitaxial layers grown on the substrate, with a similar process as described above.

Then, a current blocking layer 12 is formed on the n-InP substrate 11 by growing a p-InP layer under the masked condition of the mesa stripe. A liquid-phase epitaxial method (LPE method) or a vapor phase epitaxial method (e.g. MOCVD method) is used for the growth of the p-InP current blocking layer 12.

Subsequently, the mask is removed by etching and then an n-InP clad layer 13, a GaInAsP active layer 14, a p-InP clad layer 15, a p-GaInAsP etching stop layer 16, a p-InP clad layer 17 and a p-GaInAsP cap layer 18 are sequentially formed on the n-InP substrate 11 to produce a multilayered structure by the one-step growth.

Thereafter, given areas are masked (by an etching mask similar to the one as described earlier) by a photolithography technique and then the masked structure is etched to as deep as the etching stop layer 16 so that a pair of substantially parallel grooves are formed on the n-InP substrate 11 to produce a ridge having a width W2 as illustrated in FIG. 1.

Then, the two grooves are filled with polyimide resin to form resin layers in these areas.

Any excessive resin of the resin layers 19 is removed by etching to make the surface of the resin layers level of the surface of the cap layer 18. The upper surface of the n-InP substrate 11 becomes very flat at this stage.

Thereafter, insulation film 20 of $SiO_2$ or $Si_3N_4$ is deposited on the upper surface and a contact window is formed by a photolithography technique as described above.

The position of the window area does not have to be limited within ridge area so long as it has a width smaller than the distance W3 between the outer boundaries of the two grooves.

Then, a p-side electrode is formed on the upper surface of the multilayered structure on the n-InP substrate 11, while a n-side electrode 22 is formed on the lower surface of the n-InP substrate 11 by using a known technique.

A semiconductor laser device produced through a manufacturing process as described above has a current confinement structure that enables electric current to be confined because of a p-InP current blocking layer 12 sandwiched by an n-InP substrate 11 and an n-InP clad layer 13 and pn reverse junction existing between a p-InP current blocking layer 12 and an n-InP clad layer 13.

With such a configuration, the resin layers 19 effectively eliminate the necessity of confining the window of insulating layer 20 for ohmic contact between the p-GaInAsP cap layer 18 and the p-side electrode 21 within an area of the ridge. This means that the ridge stripe width can be reduced below the lasing threshold current level as compared with that of a conventional semiconductor laser device.

The polyimide resin has a refractive index of 1.8 and a thermal expansion coefficient which is substantially equal to $4.5 \times 10^{-6}$ K or the thermal expansion coefficient of InP. Therefore, because the resin layers are made of polyimide resin, the semiconductor laser device is free from problems concerning the waveguide structure and thermal stress.

If junction down bonding is conducted for a semiconductor laser device according to the invention, taking advantage of the fact that the grooves for resin layers are filled with polyimide resin, the heat conductance capability of the device will be further improved.

The resin layers 19 may be replaced by crystal of a semi-insulating or n-type semiconductive material having a refractive index smaller than that of InP.

While a p-InP clad layer 15 is formed on a GaInAsP active layer 14 and a p-GaInAsP etching stop layer 16 is formed on the p-InP clad layer 15 in the above embodiment, those two layers may be replaced by a single antimeltback layer formed directly on the active layer 14.

The use of an active layer 14 having a DCC structure in place of the single bulk layer may further improve the various characteristics of the embodiment.

A second embodiment of the invention will be described below by referring to FIG. 2.

Figure 2:
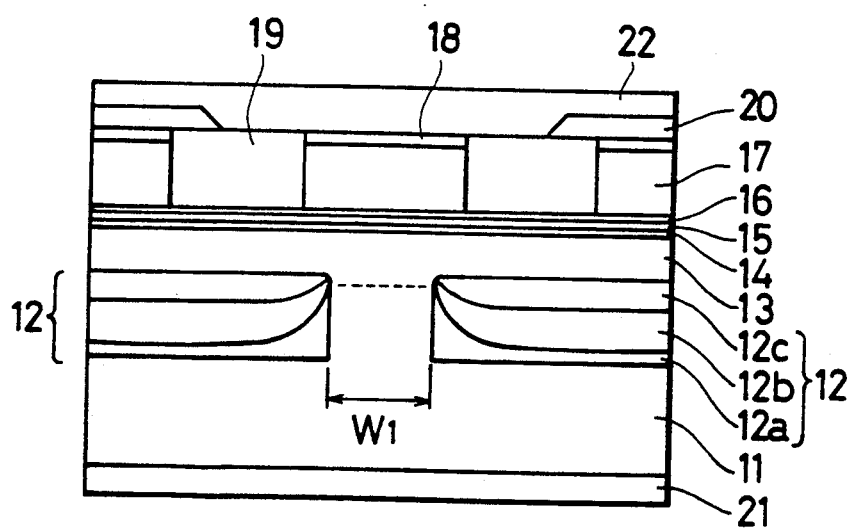
FIG. 2 is a sectional view of a second embodiment of the semiconductor laser device according to the invention.

The substrate 11 of the embodiment of FIG. 2 is made of p-InP and the current blocking layer 12 has a multilayered structure comprising a Fe doped semi-insulating layer 12b sandwiched by upper and lower n-InP layers 12a and 12c.

The remaining parts of the embodiment are identical with or similar to the corresponding ones of the first embodiment as described in conjunction with FIG. 1.

It is well known that when a Fe-doped semi-insulating layer is brought to contact with a p-InP layer during a growth step, the semi-insulating property of the Fe-doped semi-insulating layer is deteriorated.

With a semiconductor laser device as illustrated in FIG. 2, the Fe doped InP layer 12b is sandwiched by the two n-InP layers to prevent direct contact. Therefore, the semi-insulating property of the current blocking layer 12 is not deteriorated and the functions of the layer are fully preserved.

Finally, a third preferred embodiment of the invention will be described by referring to FIG. 3.

Figure 3:
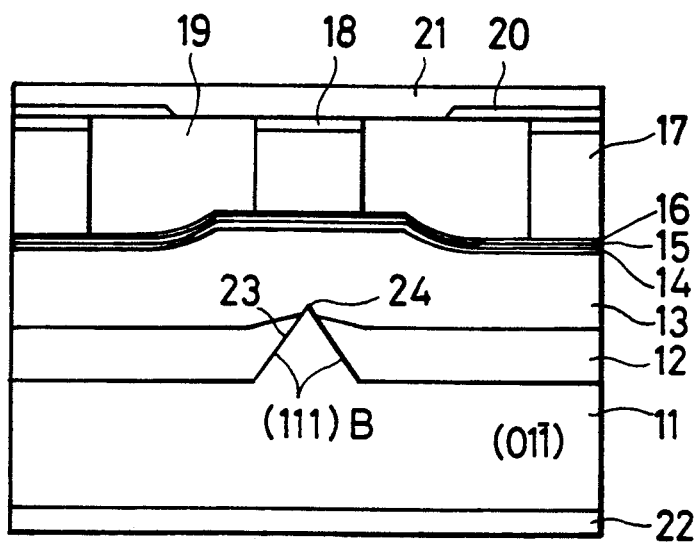
FIG. 3 is a sectional view of a third embodiment of the semiconductor laser device according to the invention.
Figure 4:
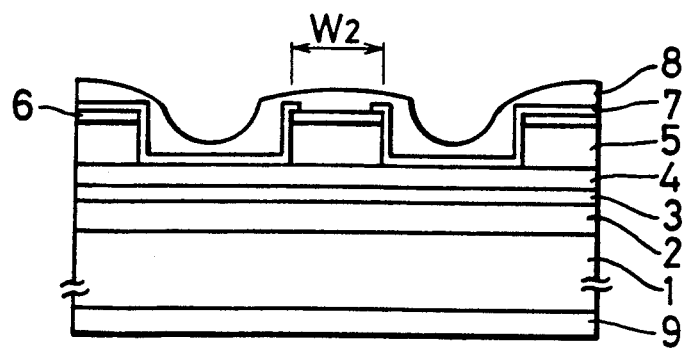
FIG. 4 is a sectional view of a conventional semiconductor laser device.

In a semiconductor laser device as illustrated in FIG. 3, a mesa stripe having a pair of symmetrical lateral surfaces (111) B having isosceles triangular (01$\bar{1}$) cross section is formed to contact the upper surface of an n-InP substrate 11 and partly project into the lower portion of an n-InP clad layer 13 sandwiched to form a narrow channel. The current blocking layer 12 partly covers the mesa stripe 23 and is sandwiched by the substrate 11 and the n-InP clad 13.

The above description holds true with regard to the cleavage surface (01$\bar{1}$) not shown in FIG. 3.

The remaining parts of the embodiment are identical with or similar to the corresponding ones of the first and second embodiments as described earlier shown in FIGS. 1 and 2.

For a semiconductor laser device as illustrated in FIG. 3, a stripe 23 running in the direction of (01$\bar{1}$) can be formed by wet etching with mask or by the epitaxial growth with mask or on the ridge stripe. Thereafter a p-InP current blocking layer 12 and an n-InP clad layer 13 as well as all other layers up to layer 18 can continuously grow thereon to produce narrow n-InP channels 24.

Some techniques for the above described method are described by A. Yoshikawa, et al., Journal of Crystal Growth 93, pp. B43–849, 1988; and K. M. Dzurko, et al., Appl. Phys. Lett. 54, pp. 105–107, 1989.

The active layer 14 of each of the above described embodiments may have either a single quantum well structure or a multiple quantum well structure and comprise an optical confinement layer having either an SCH structure or a GRIN-SCH structure.

Since a semiconductor laser device according to any of the claims has a low threshold current, a small $\Theta_\perp/\Theta_\parallel$ ratio, a narrow ridge stripe width and improved thermal characteristics, the present invention provides a useful and effective semiconductor laser device.

The above description is intended by way of example only and is not intended to limit the present invention in any way except as set forth in the following claims.

We claim:

1. A semiconductor laser diode including an InP substrate of a first conductivity type, a double-heterostructure including at least an active layer and a pair of cladding layers of a first and a second conductivity type, ridge guide structure formed by etching off part of said cladding layer of said second conductivity type, current confining structure formed between said cladding layer of said first conductivity type and said substrate, a pair of reflecting means for optical feedback, and a pair of ohmic metals, said current confining structure consisting of an InP convex mesa stripe formed by etching off part of said substrate or part of an epitaxial layer on said substrate, and an InP current blocking layer of a second conductivity type embedded at both sides of said mesa stripe.

2. A semiconductor laser diode including an n-InP substrate, a double-heterostructure including at least an active layer and a pair of cladding layers of n-type and p-type, ridge guide structure formed by etching off part of said cladding layer of said n-type, current confining structure formed between said cladding layer of n-type and said substrate, a pair of reflecting means for optical feedback, and a pair of ohmic metals, said current confining structure consisting of an n-InP convex mesa stripe formed by etching off part of said substrate or part of an epitaxial layer on said substrate, and an Fe-doped semi-insulating InP current blocking layer embedded at both sides of said mesa stripe.

3. A semiconductor laser diode including a p-InP substrate, a double-heterostructure including at least an active layer and a pair of cladding layers of n-type and p-type, ridge guide structure formed by etching off part of said cladding layer of said p-type, and current confining structure formed between said cladding layer of p-type and said substrate, a pair of reflecting means for optical feedback, and a pair of ohmic metals, said current confining structure consisting of a p-InP convex mesa stripe formed by etching off part of said substrate or part of an epitaxial layer on said substrate, and current blocking layers consisting of a first n-InP layer, a Fe doped InP semi-insulating layer and a second n-InP layer embedded at both sides of said mesa stripe.

4. A semiconductor laser, diode including a (100) oriented InP substrate of a first conductivity type, a double-heterostructure including at least an active layer and a pair of cladding layers of a first and second conductivity type, ridge guide structure formed by etching off part of said cladding layer of said second conductivity, current confining structure formed between said cladding layer of said first conductivity type and said substrate, a pair of reflecting means for optical feedback and a pair of ohmic metals, said current confining structure consisting of an InP mesa stripe having an isosceles triangle in cross section in a (01$\bar{1}$) cleavage surface and having a pair of symmetrical surfaces (111)B and an InP current blocking layer of a second conductivity type partly covering said triangle shaped mesa stripe and embedded at both sides of said mesa stripe so that the top part of the mesa stripe projecting into said cladding layer of said first conductivity type forms a current injection channel.

5. A semiconductor laser diode including a (100) oriented InP substrate of a first conductivity type, a double-heterostructure including at least an active layer and a pair of cladding layers of a first and a second conductivity type, ridge guide structure formed by etching off part of said cladding layer of said second conductivity, current confining structure formed between said cladding layer of said first conductivity type and said substrate, a pair of reflecting means for optical feedback, and a pair of ohmic metals, said current confining structure consisting of an InP convex mesa stripe having an isosceles triangle in cross section in (01$\bar{1}$) cleavage surface and having a pair of symmetrical surfaces (111)B, and current blocking layers including at least an Fe-doped semi-insulating InP layer partly covering said triangle shaped mesa stripe and embedded at both sides of said mesa stripe, so that the top part of said mesa stripe projecting into said cladding layer of said first conductivity forms a current injection channel.

6. A semiconductor laser diode including an p-InP substrate, a double-heterostructure including at least an active layer and a pair of cladding layers of first and a second conductivity type, ridge guide structure formed by etching off part of said cladding layer of said second conductivity type, current confining structure formed between said cladding layer of said first conductivity type and said substrate, a pair of reflecting means for optical feedback, and a pair of ohmic metals, said current confining structure consisting of an InP convex mesa stripe, and an InP current blocking layer of a second conductivity type embedded at both sides of said mesa stripe, and wherein an etched off part of said cladding layer of said secondary conductivity type is embedded in resin layers.

7. A semiconductor laser diode according to claim 2, wherein both sides of said ridged stripe are embedded in resin layer.

8. A semiconductor laser diode according to claim 3, wherein both sides of said ridged stripe are embedded in resin layer.

9. A semiconductor laser diode according to claim 4, wherein both sides of said ridged stripe are embedded in resin layer.

10. A semiconductor laser diode according to claim 5, wherein both sides of said ridged stripe are embedded in resin layer.

11. A semiconductor laser diode according to claim 1, wherein said active layer comprises a single quantum well structure or multi-quantum well structure.

12. A semiconductor laser diode according to claim 2, wherein said active layer comprises a single quantum well structure or multi-quantum well structure.

13. A semiconductor laser diode according to claim 3, wherein said active layer comprises a single quantum well structure or multi-quantum well structure.

14. A semiconductor laser diode according to claim 4, wherein said active layer comprises a single quantum well structure or multi-quantum well structure.

15. A semiconductor laser diode according to claim 5, wherein said active layer comprises a single quantum well structure or multi-quantum well structure.

* * * * *